US009366593B2

(12) United States Patent
Vaupel et al.

(10) Patent No.: US 9,366,593 B2
(45) Date of Patent: Jun. 14, 2016

(54) PRESSURE SENSOR PACKAGE WITH INTEGRATED SEALING

(71) Applicant: Infineon Technologies AG, Neubiberg (DE)

(72) Inventors: Mathias Vaupel, Regensburg (DE); Horst Theuss, Wenzenbach (DE); Helmut Wietschorke, Laberweinting (DE)

(73) Assignee: Infineon Technologies AG, Neubiberg (DE)

( * ) Notice: Subject to any disclaimer, the term of this patent is extended or adjusted under 35 U.S.C. 154(b) by 297 days.

(21) Appl. No.: 14/039,706

(22) Filed: Sep. 27, 2013

(65) Prior Publication Data

US 2015/0090042 A1    Apr. 2, 2015

(51) Int. Cl.
*G01L 9/00* (2006.01)
*B81B 7/00* (2006.01)
*B81C 1/00* (2006.01)
*G01L 19/00* (2006.01)

(52) U.S. Cl.
CPC .............. *G01L 9/0045* (2013.01); *B81B 7/0048* (2013.01); *B81C 1/00325* (2013.01); *G01L 9/0042* (2013.01); *G01L 9/0054* (2013.01); *G01L 19/0007* (2013.01); *B81B 2201/0264* (2013.01); *H01L 2224/48091* (2013.01); *H01L 2224/48247* (2013.01); *H01L 2924/1815* (2013.01)

(58) Field of Classification Search
CPC .................. H01L 21/56; B81B 3/0021; B81B 2201/0264; B81B 7/0061; B81B 2207/097; B81B 7/0058; B81B 7/0048; B81C 1/00325; G01L 19/146; G01L 19/0007; G01L 9/0045
USPC .......................................................... 73/725
See application file for complete search history.

(56) References Cited

U.S. PATENT DOCUMENTS 5,721,446 A * 2/1998 Kobayashi ............ G01L 19/147
                                                 257/417
5,863,810 A * 1/1999 Kaldenberg ........ H01L 31/0203
                                              257/E31.118

(Continued)

OTHER PUBLICATIONS

Unknown, Author, "Surface Mount Piezoresistive Silicon Absolute Pressure Sensor 60 . . . 115 kPa." Product Datasheet, Aug. 2006, pp. 1-2, Robert Bosch GmbH.
Unknown, Author, "High Temperature Accuracy Integrated Silicon Pressure Sensor for Measuring Absolute Pressure, On-Chip Signal Conditioned, Temperature Compensated and Calibrated." Product Datasheet, MPXH6250A Series, Jan. 2007, pp. 1-11, Rev. 2, Freescale Semiconductor.

(Continued)

*Primary Examiner* — Freddie Kirkland, III
(74) *Attorney, Agent, or Firm* — Murphy, Bilak & Hommiller, PLLC

(57) ABSTRACT

A pressure sensor package includes a lead and a semiconductor die spaced apart from the lead and including a terminal and a diaphragm disposed at a first side of the die. The die is configured to change an electrical parameter responsive to a pressure difference across the diaphragm. The package further includes an electrical conductor connecting the terminal to the lead, a molding compound encasing the electrical conductor, the die and part of the lead, a cavity in the molding compound exposing the diaphragm, and a sealing ring disposed on a side of the molding compound with the cavity. The sealing ring surrounds the cavity and has a lower elastic modulus than the molding compound. Alternatively, the sealing ring can be a ridge of the molding compound that protrudes from the side of the molding compound with the cavity and surrounds the cavity. A package manufacturing method is also provided.

26 Claims, 20 Drawing Sheets

(56) References Cited

U.S. PATENT DOCUMENTS

| | | | | |
|---|---|---|---|---|
| 5,897,338 | A * | 4/1999 | Kaldenberg | H01L 21/565 216/33 |
| 6,140,144 | A * | 10/2000 | Najafi | B81C 1/00269 438/106 |
| 6,169,316 | B1 * | 1/2001 | Sakai | G01L 19/146 257/417 |
| 6,379,988 | B1 * | 4/2002 | Peterson | B81C 1/00333 257/E21.502 |
| 6,551,853 | B2 * | 4/2003 | Toyoda | H01L 29/84 257/E29.324 |
| 7,952,153 | B2 * | 5/2011 | Chen | G01L 19/141 257/415 |
| 8,044,929 | B2 * | 10/2011 | Baldo | G01L 9/0045 345/156 |
| 8,674,462 | B2 * | 3/2014 | Wombacher | H01L 23/055 257/415 |
| 8,901,739 | B2 * | 12/2014 | Fuergut | H01L 21/56 257/415 |
| 8,937,380 | B1 * | 1/2015 | Vaupel | B81B 7/0054 257/676 |
| 9,013,013 | B1 * | 4/2015 | Beer | G01L 19/0069 257/415 |
| 9,013,014 | B2 * | 4/2015 | Winkler | B81B 7/0061 257/415 |
| 9,021,887 | B2 * | 5/2015 | Kalz | B81B 7/02 73/777 |
| 9,032,818 | B2 * | 5/2015 | Campbell | G01L 1/148 73/862.628 |
| 2006/0289415 | A1 * | 12/2006 | Muehlheim | B81B 7/0012 219/209 |
| 2008/0157236 | A1 * | 7/2008 | Chen | G01L 19/141 257/415 |

OTHER PUBLICATIONS

Unknown, Author, "100 kPa On-Chip Temperature Compensated Silicon Pressure Sensors." Product Datasheet, MPX2102 Series, Oct. 2008, pp. 1-16, Rev. 7, Freescale Semiconductor.

Unknown, Author, "High Temperature Accuracy Integrated Silicon Pressure Sensor for Measuring Absolute Pressure, On-Chip Signal Conditioned, Temperature Compensated and Calibrated." Product Datasheet, MPXA6115A Series, Oct. 2009, pp. 1-17, Rev. 5, Freescale Semiconductor.

Unknown, Author, "Miniature Signal Conditioned." Honeywell Interactive Catalog, no publication date provided, 40PC Series, pp. 31-33, Honeywell International Inc.

Unknown, Author, "Digital Output Pressure Sensors 0psi to 1 psi through 0 psi to 100 psi." Product Datasheet, ASDX DO Series, Oct. 2008, pp. 1-4, Honeywell International Inc.

Unknown, Author, "Low Cost Compensated Pressure Sensors in DIP Package." Product Datasheet, SDX Series, Jun. 2008, pp. 1-4, SenSym.

Unknown, Author, "Signal Conditioned Pressure Transducers." Product Datasheet, ASDX Series, Jun. 2009, pp. 1-6, SenSym.

Unknown, Author. "Media Resistant and High Temperature Accuracy Integrated Silicon Pressure Sensor for Measuring Absolute Pressure, On-Chip Signal Conditioned, Temperature Compensated and Calibrated." Product Datasheet, MPXAZ6115A Series, Jan. 2007, pp. 1-15, Rev. 4, Freescale Semiconductor.

Unknown, Author. "BMP085 Digital Pressure Sensor." Product Datasheet, Jul. 1, 2008, pp. 1-25, Rev. 1.0, Bosch Sensortec GmbH.

* cited by examiner

PRESSURE SENSOR PACKAGE WITH INTEGRATED SEALING

TECHNICAL FIELD

The present application relates to molded semiconductor packages, in particular molded pressure sensor packages.

BACKGROUND

Pressure sensor semiconductor dies include a diaphragm for sensing pressure. The sensed pressure is converted to an electrical parameter such as change in resistivity. Pressure sensor dies are typically encased in a molding compound to protect the connections to the die and the die itself from corrosion and other adverse effects. Molding compounds typically have an elastic modulus of greater than 1 GPa at room temperature and therefore are relatively hard. Conventional molded pressure sensor packages have a window or cavity in the molding compound over the diaphragm of the pressure sensor die so that the diaphragm remains uncovered by the molding compound.

For pressure sensor applications, a mechanical coupling is provided between a molded pressure sensor package and a module housing such as a side air bag module for an automobile. A flexible seal is required to ensure a full and unrelenting pressure is redirected to the diaphragm of the pressure sensor die. The flexible seal should not exert any excessive force on the pressure sensor package and thus on the pressure sensor die, otherwise the electrical functionality of the pressure sensor die may be impaired. Conventionally, such a flexible seal is realized after the pressure sensor package is placed within the module housing e.g. such as the housing for a side air bag module. Significant effort is required by the module integrator to form a proper seal between a molded pressure sensor package and the module housing.

SUMMARY

According to an embodiment of a pressure sensor package, the package comprises a lead and a semiconductor die spaced apart from the lead. The die comprises a terminal and a diaphragm disposed at a first side of the die. The die is configured to change an electrical parameter responsive to a pressure difference across the diaphragm. The pressure sensor package further comprises an electrical conductor connecting the terminal to the lead, a molding compound encasing the electrical conductor, the die and part of the lead, a cavity in the molding compound exposing the diaphragm, and a sealing ring disposed on a side of the molding compound with the cavity. The sealing ring surrounds the cavity and has a lower elastic modulus than the molding compound.

According to another embodiment of a pressure sensor package, the package comprises a lead and a semiconductor die spaced apart from the lead. The die comprises a terminal and a diaphragm disposed at a first side of the die. The die is configured to change an electrical parameter responsive to a pressure difference across the diaphragm. The pressure sensor package further comprises an electrical conductor connecting the terminal to the lead, a molding compound encasing the electrical conductor, the die and part of the lead, and a cavity in the molding compound exposing the diaphragm. The molding compound has a ridge protruding from the side of the molding compound with the cavity. The ridge surrounds the cavity to form a sealing ring.

According to an embodiment of a method of manufacturing a pressure sensor package, the method comprises: providing a semiconductor die and a lead spaced apart from one another, the die comprising a terminal and a diaphragm disposed at a first side of the die, the terminal connected to the lead by an electrical conductor, the die configured to change an electrical parameter responsive to a pressure difference across the diaphragm; encasing the electrical conductor, the die and part of the lead with a molding compound; forming a cavity in the molding compound that exposes the diaphragm; and forming a sealing ring on a side of the molding compound with the cavity, the sealing ring surrounding the cavity and having a lower elastic modulus than the molding compound.

Those skilled in the art will recognize additional features and advantages upon reading the following detailed description, and upon viewing the accompanying drawings.

BRIEF DESCRIPTION OF THE FIGURES

The elements of the drawings are not necessarily to scale relative to each other. Like reference numerals designate corresponding similar parts. The features of the various illustrated embodiments can be combined unless they exclude each other. Embodiments are depicted in the drawings and are detailed in the description which follows.

FIG. 14, which includes

DETAILED DESCRIPTION

The embodiments described herein provide a sealing ring for a pressure sensor package that is integrated i.e. part of the package, as a separate ring of material having a lower elastic modulus than the molding compound encasing the pressure sensor die and leads of the package, or as a ridge of the molding compound. In either case, the sealing ring is an integral part of the pressure sensor package and surrounds a cavity in the molding compound through which the diaphragm of the pressure sensor die is exposed. During subsequent higher-level assembly e.g. as part of a side air bag module for an automobile, the pressure sensor package with the integrated sealing ring can be placed within a housing of the application module and a proper seal provided between the pressure sensor package and the housing by the sealing ring. The sealing ring ensures a full and unrelenting pressure is redirected to the diaphragm of the pressure sensor die.

Figure 1:
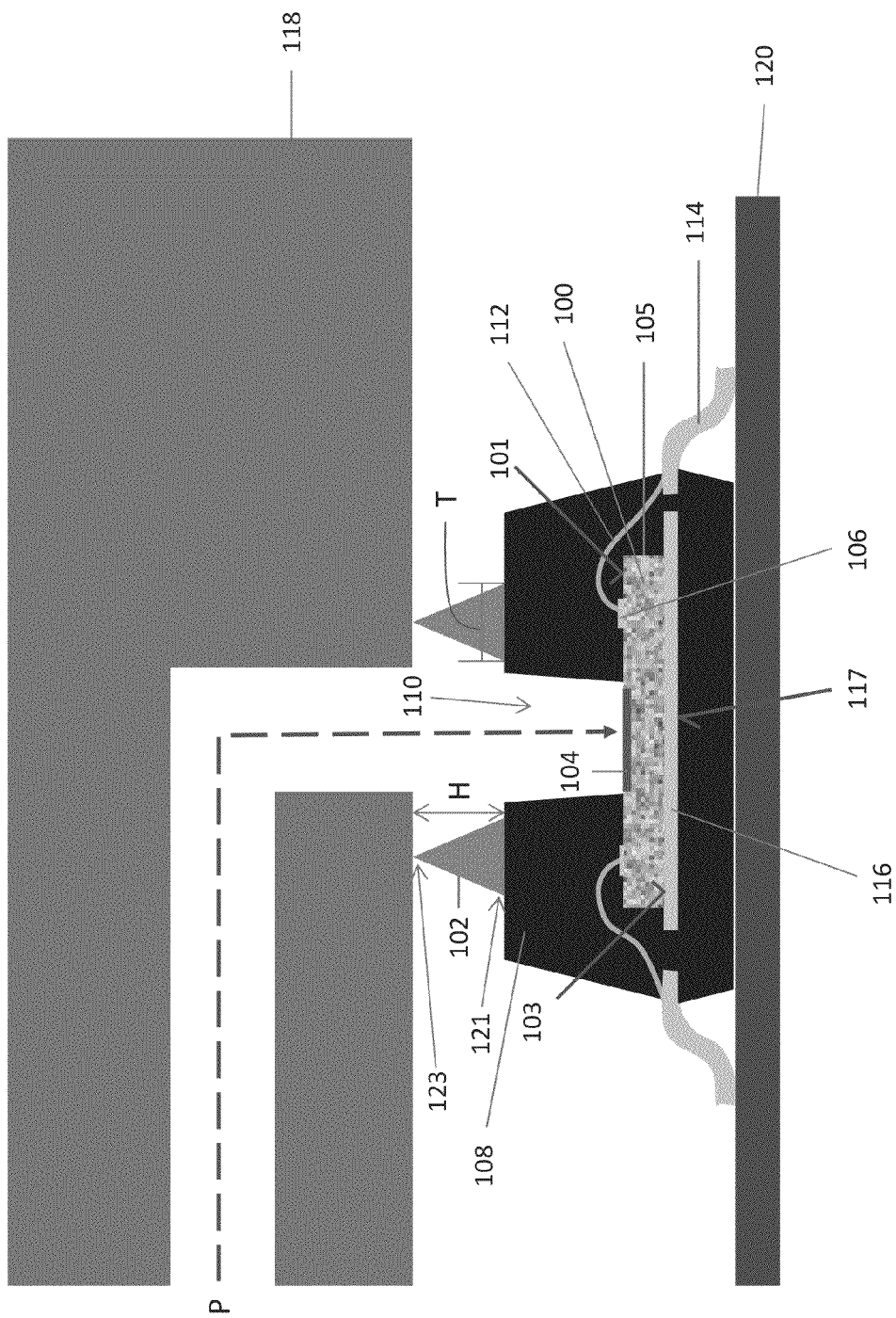
FIGS. 1 through 11 each illustrate a cross-sectional view of a different embodiment of a molded pressure sensor package with an integrated sealing ring.

FIG. 1 illustrates a cross-sectional view of an embodiment of a pressure sensor package including a pressure sensor semiconductor die 100 and an integrated sealing ring 102. The die 100 comprises a diaphragm 104 disposed at a top side 101 of the die 100. The die 100 is configured to change an electrical parameter such as resistivity responsive to a pressure difference across the diaphragm 104. For example, measurement of pressure with a silicon sensor die is based on the piezo-resistive effect. This is utilized in a silicon diaphragm in which mechanical stress leads to a change of resistivity. The mechanical stress results from a pressure difference across the diaphragm. A network of implanted resistors in the diaphragm can be used to transform the change of resistivity into an electrical signal that is proportional to the applied pressure difference. Depending on the application, the sensor can be used as a bare die or be bonded to glass for mechanical restraint or to provide a reference vacuum.

The pressure sensor die 100 further comprises a bottom side 103 opposite the top side 101, a lateral edge 105 extending between the top and bottom sides 101, 103 and at least one terminal 106 at the top side 101 of the die 100. The die 100 is encased in a molding compound 108 to protect the die 100 and the die terminals 106 from corrosion and other adverse effects. A cavity 110 is provided in the molding compound 108 over the diaphragm 104 to ensure that the molding compound 108 does not interfere with operation of the diaphragm 104. The cavity 110 can be formed in the molding compound 108 using any suitable standard processing such as film-assisted molding in which an insert (not shown) is positioned over the diaphragm 104 in an injection mold. The insert is removed after molding, yielding the cavity 110 in the molding compound 108. Any standard molding compound used in semiconductor packages and having an elastic modulus greater than 1 GPa at room temperature can be used to encase the pressure sensor die 100 and the electrical connections provided to the terminals 106 of the die 100.

The electrical connections to the die terminals 106 can be realized by bond wires, bond ribbons, metal clips, or any other type of suitable electrical conductor 112. One end of each electrical conductor 112 is connected to a terminal 106 of the die 100 and the opposite end is connected to a corresponding lead 114 of the package. These connections can be formed by soldering, gluing, ultrasonic bonding, etc. The leads 114 are spaced apart from the pressure sensor die 100 and partly encased by the molding compound 108 so that the leads 114 protrude from the molding compound 108 to provide points of external electrical connection to the pressure sensor die 100.

The pressure sensor die 100 can be attached to a support substrate 116 such as a die paddle of a lead frame or a ceramic material. The back side 117 of the support substrate 116 can be exposed to provide a thermal and/or electrical pathway to the pressure sensor die 100. For example in the case of a vertical die 100, current flows through the semiconductor material between the front and back sides 101, 103 of the die 100. The support substrate 116 can be electrically conductive (e.g. a copper block) in this case to provide an electrical pathway to the back side 103 of the die 100. In the case of a lateral die 100, current flows through the semiconductor material near the front side 101 of the die 100 between the terminals 106 at the front side 101. The support substrate 116 can be thermally conductive (e.g. ceramic) in this case to provide a thermal pathway to the back side 103 of the die 100.

In each case, the sealing ring 102 integrated as part of the pressure sensor package is disposed on the side of the molding compound with the cavity 110. The sealing ring 102 surrounds the cavity 110 so that a reliable seal is formed between the pressure sensor package and the housing 118 of an application module in which the package is disposed. A proper seal is provided between the pressure sensor package and the housing 118 by way of the sealing ring 102, which ensures a full and unrelenting pressure is redirected to the diaphragm 104 of the pressure sensor die 100 as represented by the dashed line labeled 'P' in FIG. 1. The application housing 118 can include a circuit board 120 to which the pressure sensor package is mounted.

The dimensions of the sealing ring 102 depend on the application in which the pressure sensor package is to be used. In one embodiment, the sealing ring 102 has a height (H) ranging between 0.5 mm and 1 mm and a maximum thickness (T) ranging between 0.5 mm and 2 mm.

The sealing ring 102 has a lower elastic modulus than the molding compound 108. In one embodiment, the molding compound 108 has an elastic modulus ranging between 10 GPa and 100 GPa at room temperature and the sealing ring 102 has an elastic modulus ranging between 0.5 MPa and 1 GPa at room temperature. For example, the sealing ring 102 can comprise a silicone or a thermoplastic elastomer. Silicones are inert, synthetic compounds with a variety of forms and uses. Typically heat-resistant and rubber-like, silicones are polymers that include silicon together with carbon, hydrogen, oxygen, and sometimes other elements. Thermoplastic elastomers, sometimes referred to as thermoplastic rubbers, are a class of copolymers or a physical mix of polymers (usually a plastic and a rubber) which consist of materials with both thermoplastic and elastomeric properties. While most elastomers are thermosets, thermoplastics are in contrast relatively easy to use in manufacturing, for example, by injection molding. Thermoplastic elastomers show advantages typical of both rubbery materials and plastic materials. The principal difference between thermoset elastomers and thermoplastic elastomers is the type of crosslinking bond in their structures. Crosslinking is a critical structural factor which contributes to impart high elastic properties. The crosslink in thermoset polymers is a covalent bond created during the vulcanization process. On the other hand, the crosslink in thermoplastic elastomer polymers is a weaker dipole or hydrogen bond or takes place in one of the phases of the material. Wax can be removed at least from the side of the molding compound 108 with the sealing ring 102, to increase the adhesion between the molding compound 108 and the sealing ring 102.

In the embodiment shown in FIG. 1, the sealing ring 102 has a first end 121 contacting the molding compound 108 and a second end 123 opposing the first end 121 and spaced apart from the molding compound 108, with the first end 121 being thicker than the second end 123. Further according to the embodiment shown in FIG. 1, the sealing ring 102 has a triangular cross-sectional shape.

Figure 2:
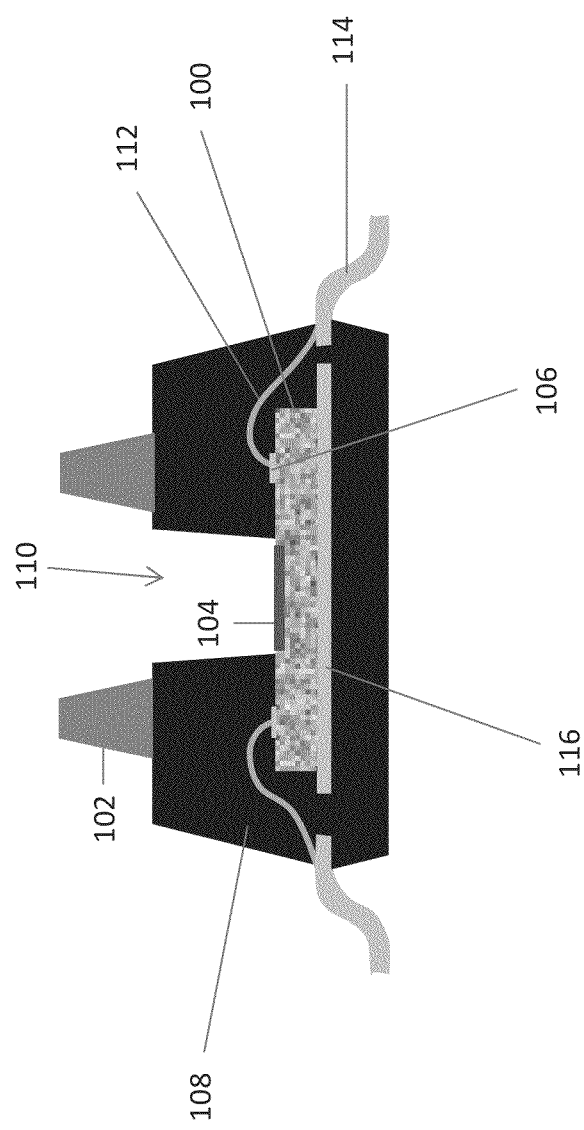

FIG. 2 illustrates another embodiment of a pressure sensor package with an integrated sealing ring 102. According to this embodiment, the sealing ring 102 has a trapezoidal cross-sectional shape.

Figure 3:
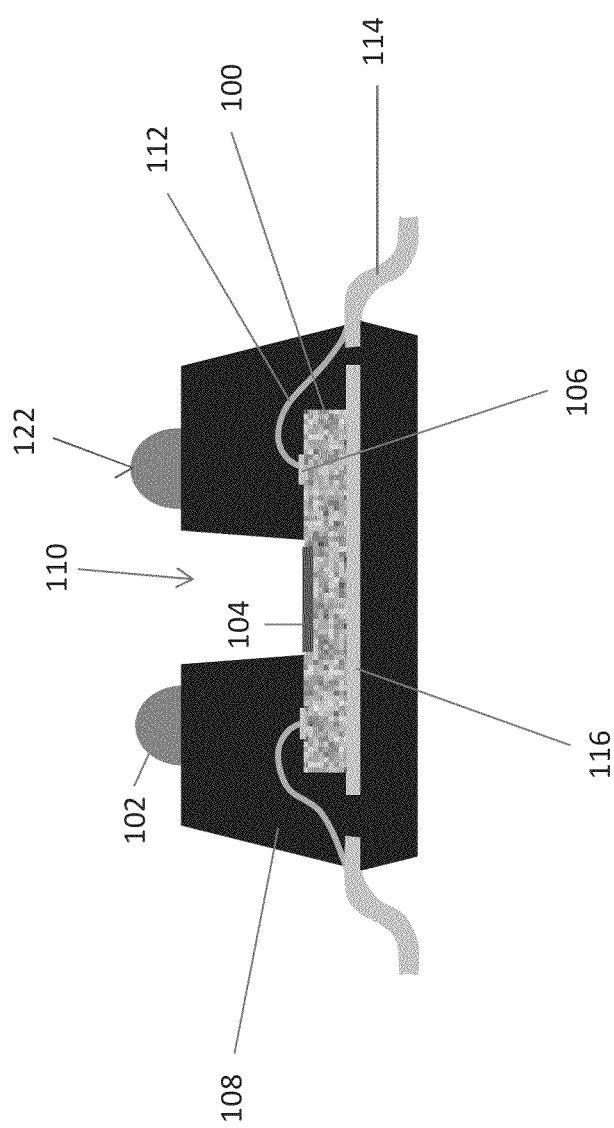

FIG. 3 illustrates another embodiment of a pressure sensor package with an integrated sealing ring 102. According to this embodiment, the sealing ring 102 has a curved outer surface 122.

Figure 4:
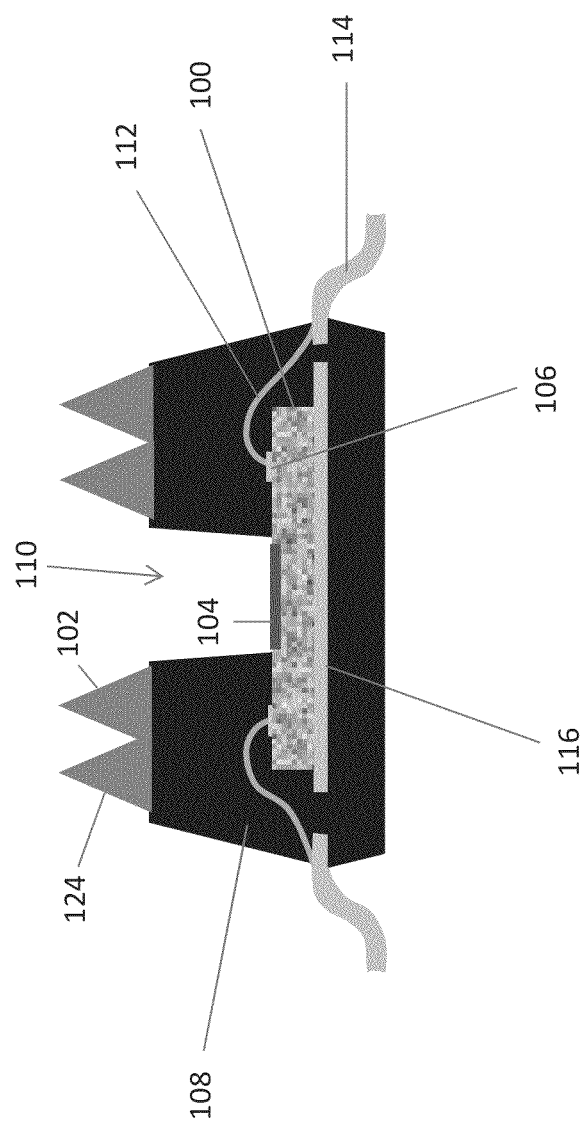

FIG. 4 illustrates another embodiment of a pressure sensor package with an integrated sealing ring 102. According to this embodiment, the pressure sensor package further comprises an additional sealing ring 124 disposed on the same side of the molding compound 108 as the other sealing ring 102. The additional sealing ring 124 surrounds the cavity 110 in the molding compound 108 and also the other sealing ring 102, and has a lower elastic modulus than the molding compound 108. Both sealing rings 102, 124 have a triangular cross-sectional shape in FIG. 4, but can have another cross-sectional shape such as trapezoidal, semi-circular, square, etc.

The sealing rings 102, 124 can have the same cross-sectional shape as shown in FIG. 4 or different cross-sectional shapes.

Figure 5:
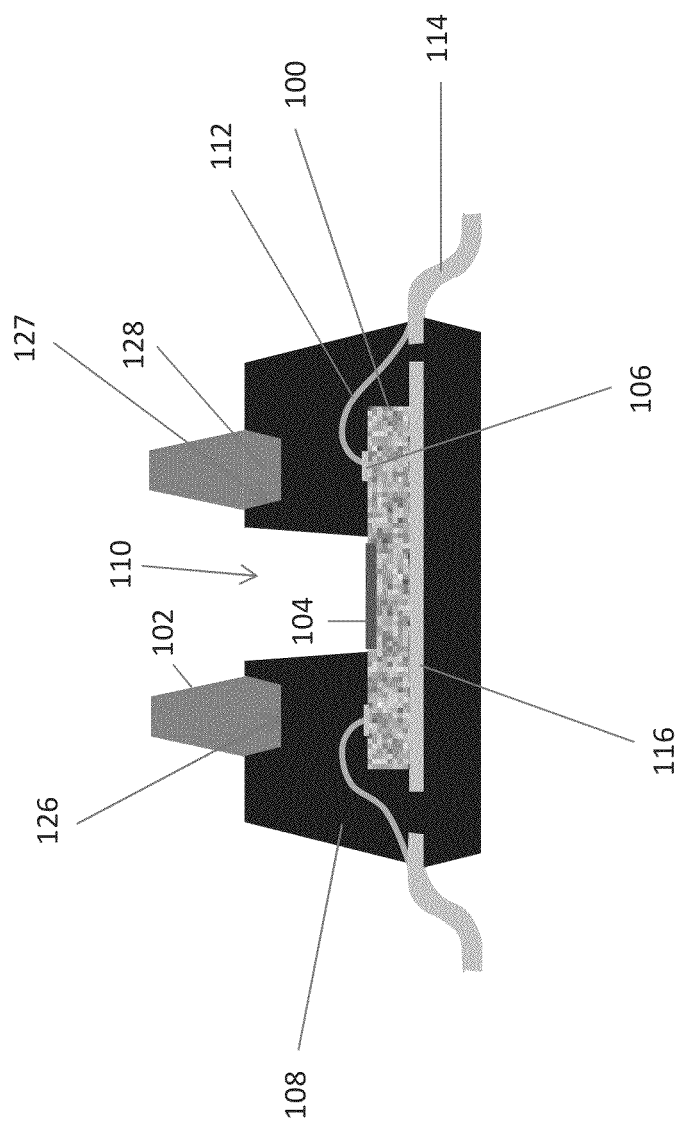

FIG. 5 illustrates another embodiment of a pressure sensor package with an integrated sealing ring 102. According to this embodiment, a trench 126 is formed in the side of the molding compound 108 with the cavity 110. The shape of the trench 126 can be accommodated by the molding process used to encase the semiconductor die 100, terminals 106 and leads 112 with the molding compound 108. After the molding process, the trench 126 is filled with a sealing material such as a silicone or thermoplastic elastomer. The sealing material extends outward from the side of the molding compound 108 with the cavity 110. The sealing material is cured to form the sealing ring 102 which has a region 128 disposed in the trench 126, anchoring the sealing ring 102 within the molding compound 108. The trench 126 can have tapered sidewalls 127 as shown in FIG. 5 to better anchor the sealing ring 102 within the molding compound 108.

Figure 6:
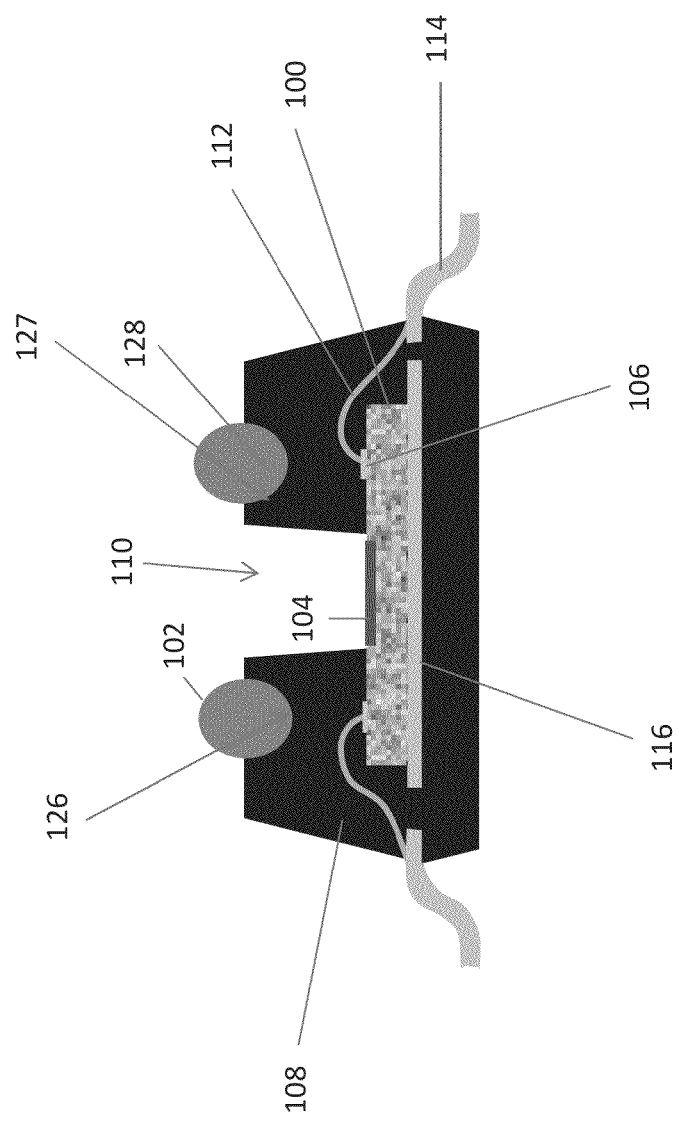

FIG. 6 illustrates an embodiment of the pressure sensor package which is similar to the embodiment shown in FIG. 5, however the integrated sealing ring 102 has a circular cross-sectional area and the sidewalls 127 and bottom of the trench 126 formed in the molding compound 108 are correspondingly curved. This arrangement provides a ball joint type of anchoring mechanism between the sealing ring 102 and the molding compound 108.

Figure 7:
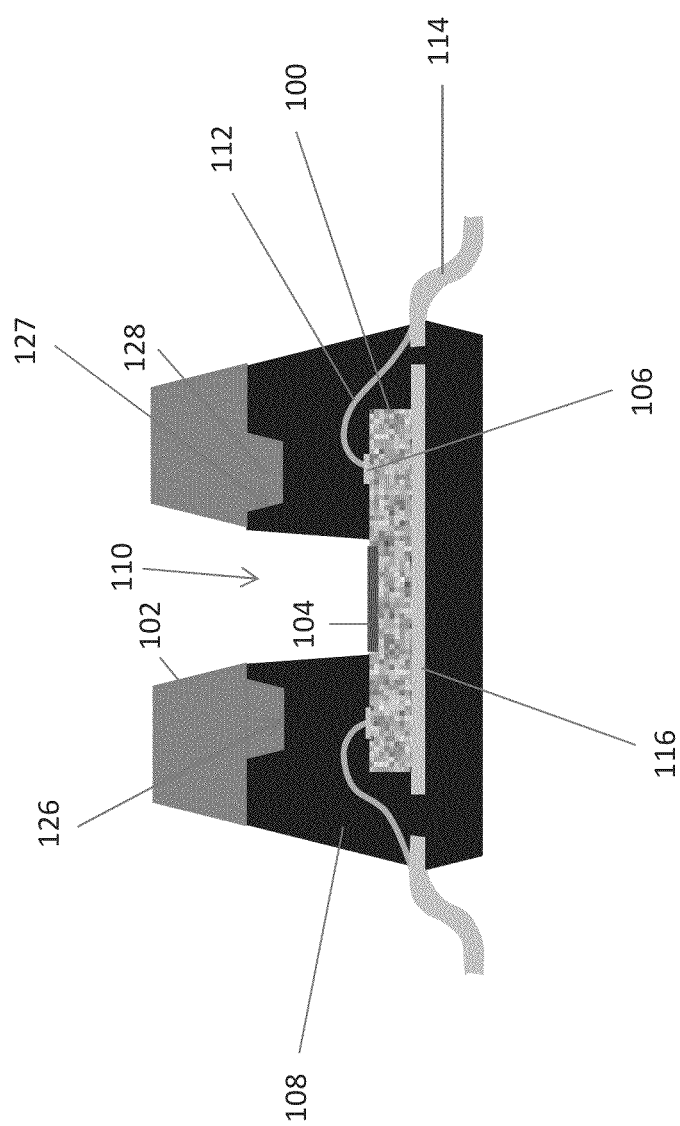

FIG. 7 illustrates another embodiment of a pressure sensor package with an integrated sealing ring 102. According to this embodiment, the sealing ring 102 completely covers the side of the molding compound 108 with the cavity 110. The sealing ring 102 is also anchored within the molding compound 108 according to this embodiment, as previously described herein.

Figure 8:
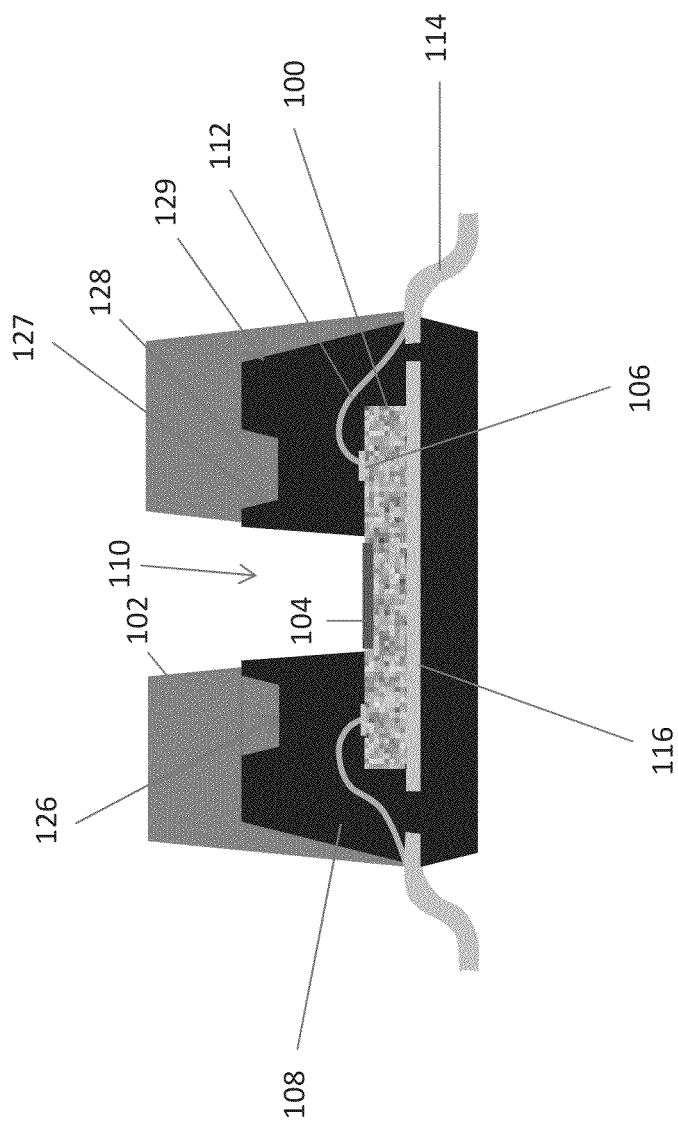

FIG. 8 illustrates an embodiment of the pressure sensor package which is similar to the embodiment shown in FIG. 7, however the sealing ring 102 also covers the sidewalls 129 of the molding compound 108.

Figure 9:
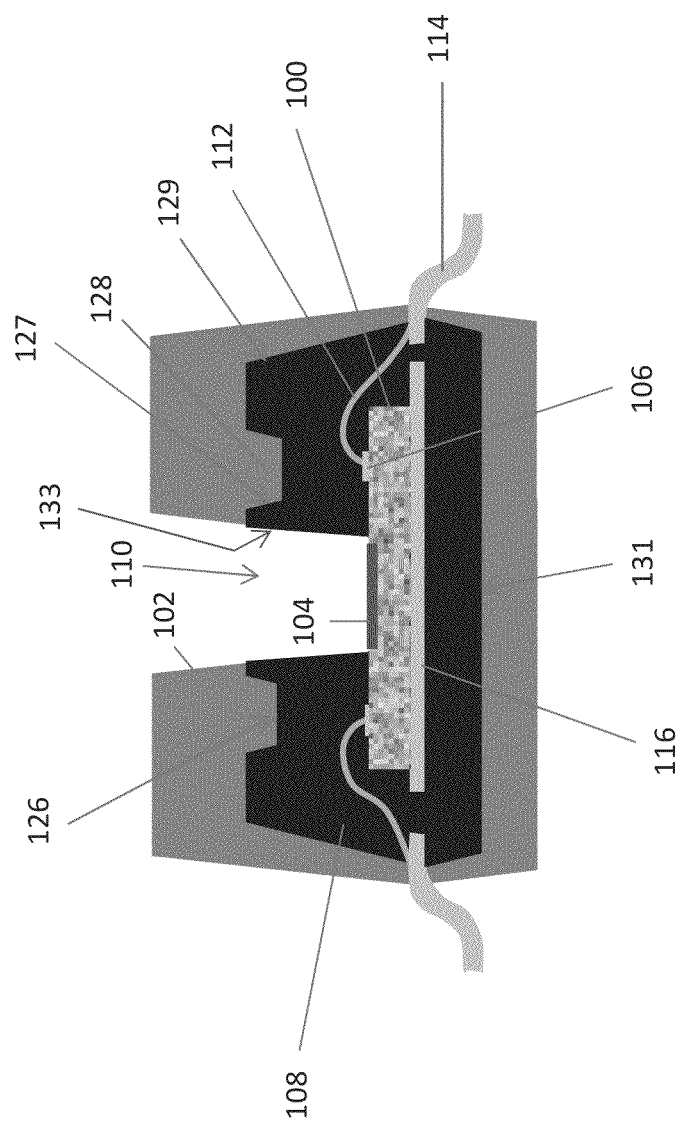

FIG. 9 illustrates an embodiment of the pressure sensor package which is similar to the embodiment shown in FIG. 8, however the sealing ring 102 also covers the side 131 of the molding compound 108 opposite the side with the cavity 110. The sealing ring 102 covers all of the molding compound 108 except along the cavity sidewalls 133 according to this embodiment.

Figure 10:
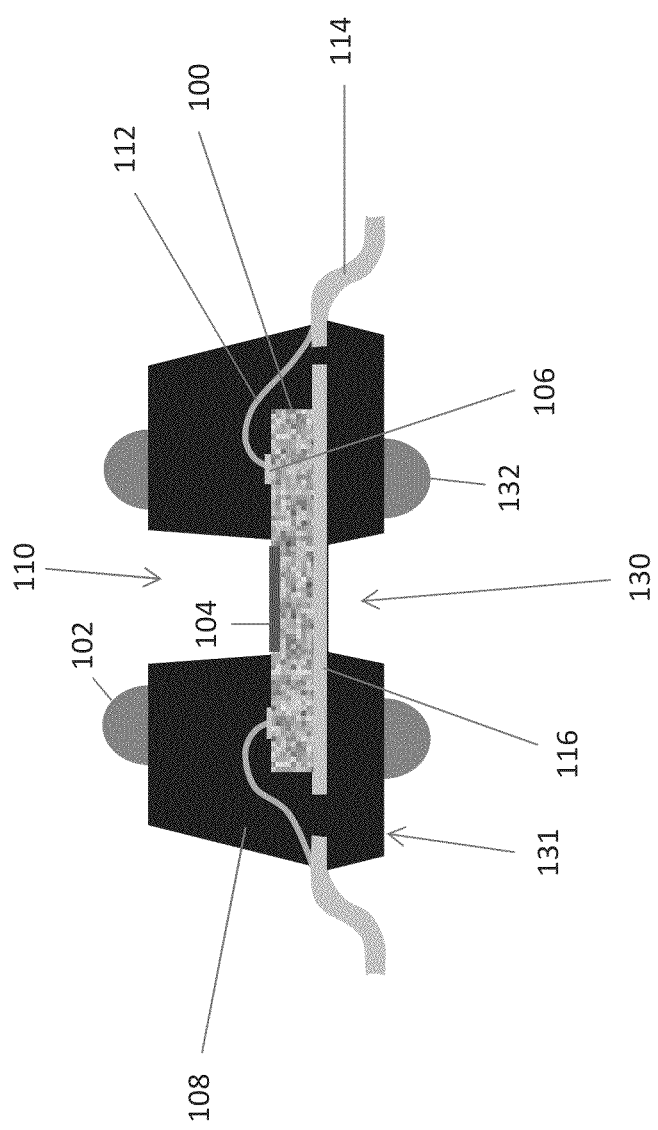

FIG. 10 illustrates another embodiment of a pressure sensor package with an integrated sealing ring 102. According to this embodiment, an additional cavity 130 is formed in the molding compound 108 at the side 131 of the molding compound 108 opposite the other cavity 110. Further according to this embodiment, an additional sealing ring 132 is disposed on the side 131 of the molding compound 108 with the additional cavity 130. The additional sealing ring 132 surrounds the additional cavity 130 and has a lower elastic modulus than the molding compound 108. For example, the additional sealing ring 132 can comprise a silicone or thermoplastic elastomer.

Figure 11:
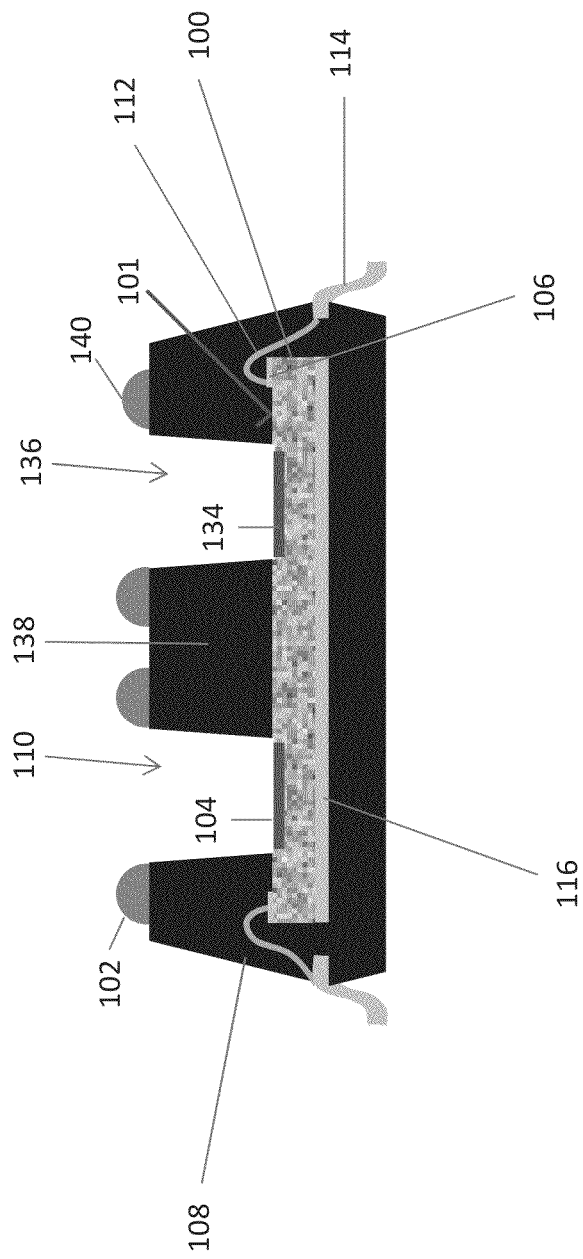

FIG. 11 illustrates another embodiment of a pressure sensor package with an integrated sealing ring 102. According to this embodiment, the pressure sensor die 100 further comprises an additional diaphragm 134 disposed at the top side 101 of the die 100 and spaced apart from the other diaphragm 104. The pressure sensor package further comprises an additional cavity 136 in the molding compound 108 at the side of the molding compound 108 with the other cavity 110. The additional cavity 136 is laterally spaced apart from the other cavity 110 by a region 138 of the molding compound 108 and exposes the additional diaphragm 134. Further according to this embodiment, an additional sealing ring 140 is disposed on the side of the molding compound 108 with both cavities 110, 136. The additional sealing ring 140 surrounds the additional cavity 136 and has a lower elastic modulus than the molding compound 108.

Figure 12:
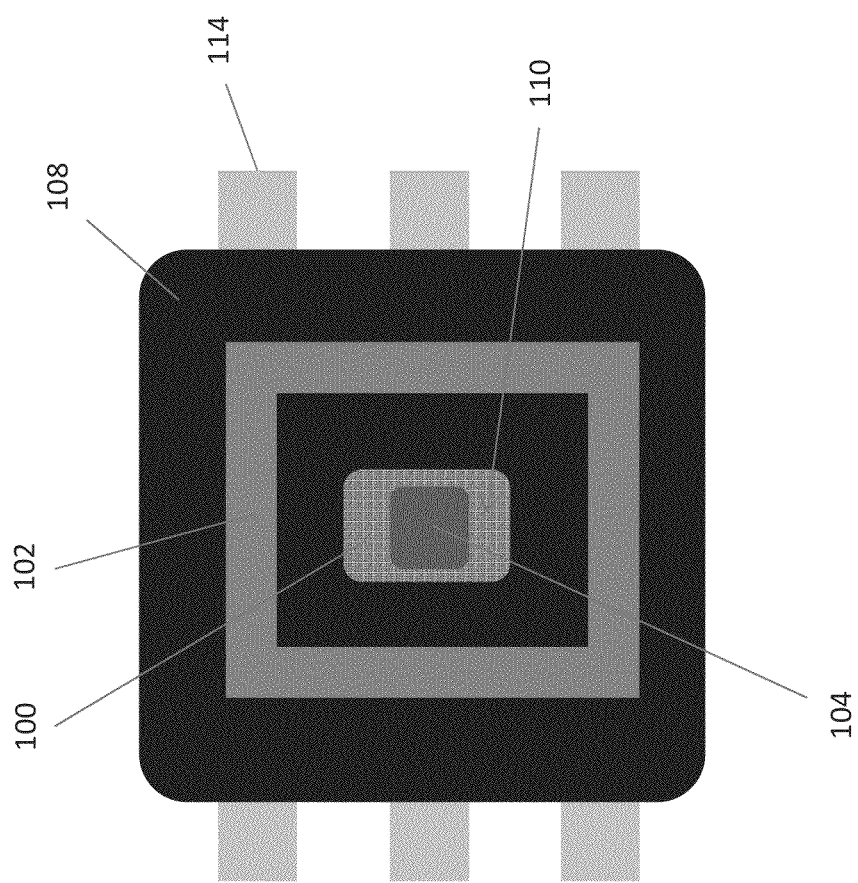
FIG. 12 illustrates a top-down plan view of an embodiment of a molded pressure sensor package with an integrated sealing ring.

FIG. 12 illustrates a top-down plan view of the pressure sensor package according to an embodiment. The sealing ring 102 surrounds the cavity 110 in the molding compound 108 and has a square shape according to this embodiment.

Figure 13:
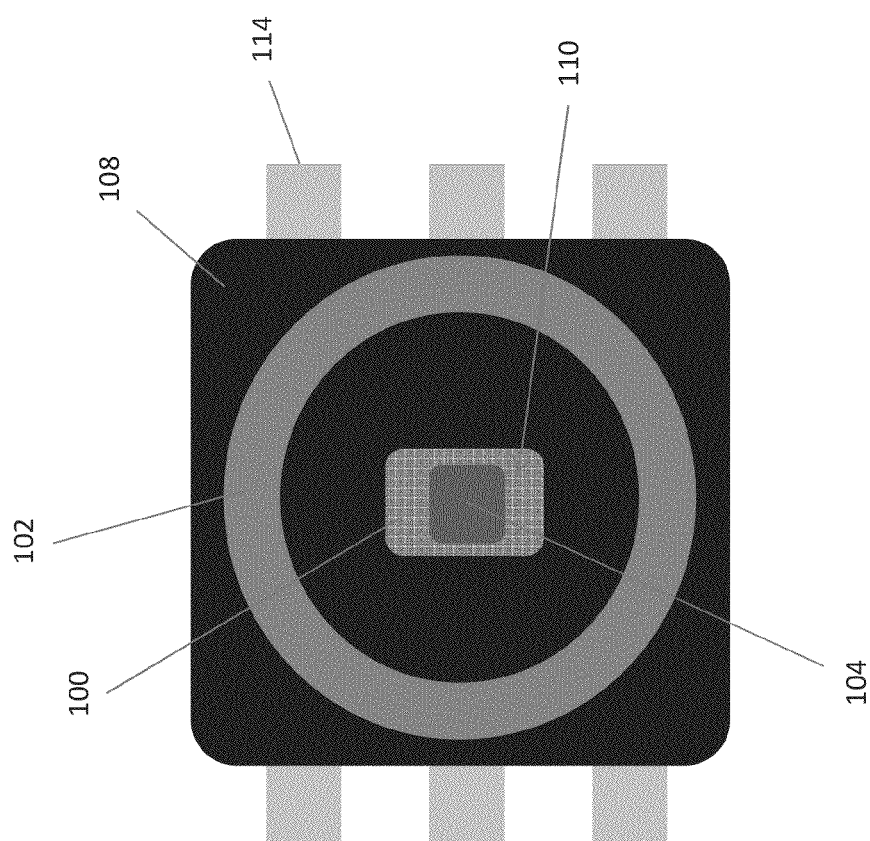
FIG. 13 illustrates a top-down plan view of another embodiment of a molded pressure sensor package with an integrated sealing ring.

FIG. 13 illustrates a top-down plan view of the pressure sensor package according to another embodiment. The sealing ring 102 surrounds the cavity 110 in the molding compound 108 and has a circular shape according to this embodiment. The sealing ring 102 can have other shapes e.g. such as rectangular.

Figure 14A:
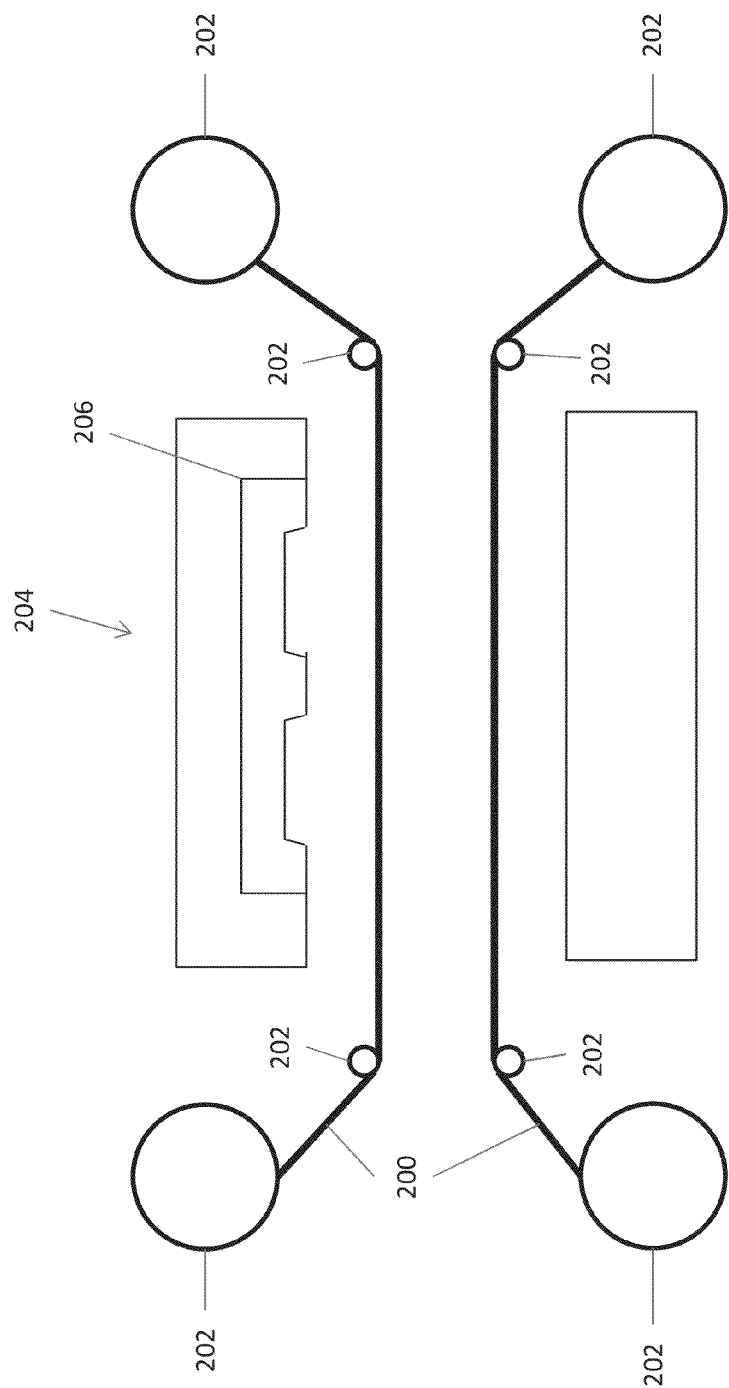
FIGS. 14A through 14E, illustrates respective cross-sectional views of an embodiment of a method of manufacturing a molded pressure sensor package having an integrated sealing ring during different stages of a film-assisted molding process.
Figure 14B:
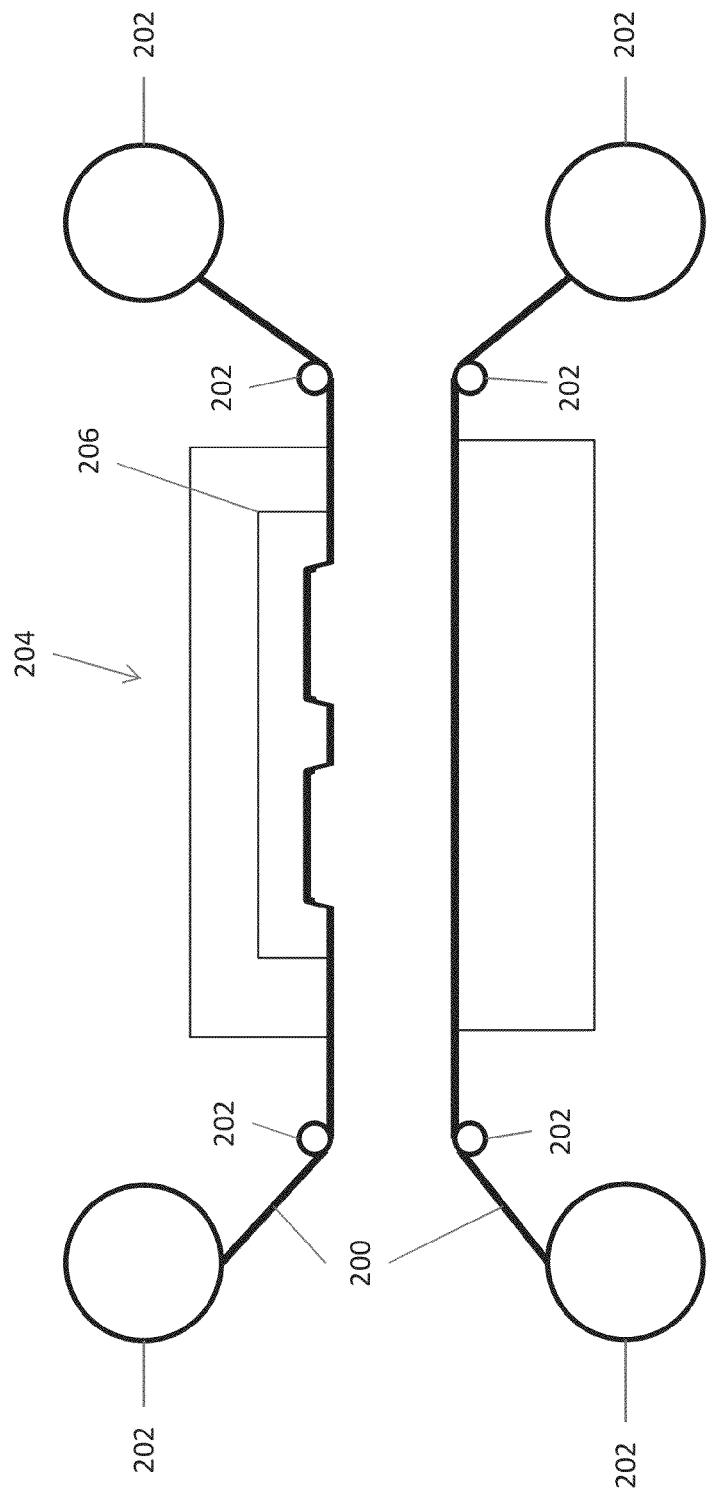

FIG. 14, which includes FIGS. 14A through 14E, illustrates an embodiment of a method of manufacturing the pressure sensor package shown in FIG. 1. According to this embodiment, a film-assisted molding (FAM) process is used. FAM is a variation on the transfer molding process. FAM uses one or two plastic films 200 fed by a series of rollers 202 into a mold 204 of a molding tool as shown in FIG. 14A. The films 200 are sucked down along the inner surfaces of a first insert 206 (including any culls, runners and cavities) placed in the mold 204 before the lead frames or substrates, i.e. the products to be encapsulated, are loaded into the mold 204 as shown in FIG. 14B. The first insert 206 defines the cavity to be formed in the molding compound. This is followed by a standard transfer molding process.

Figure 14C:
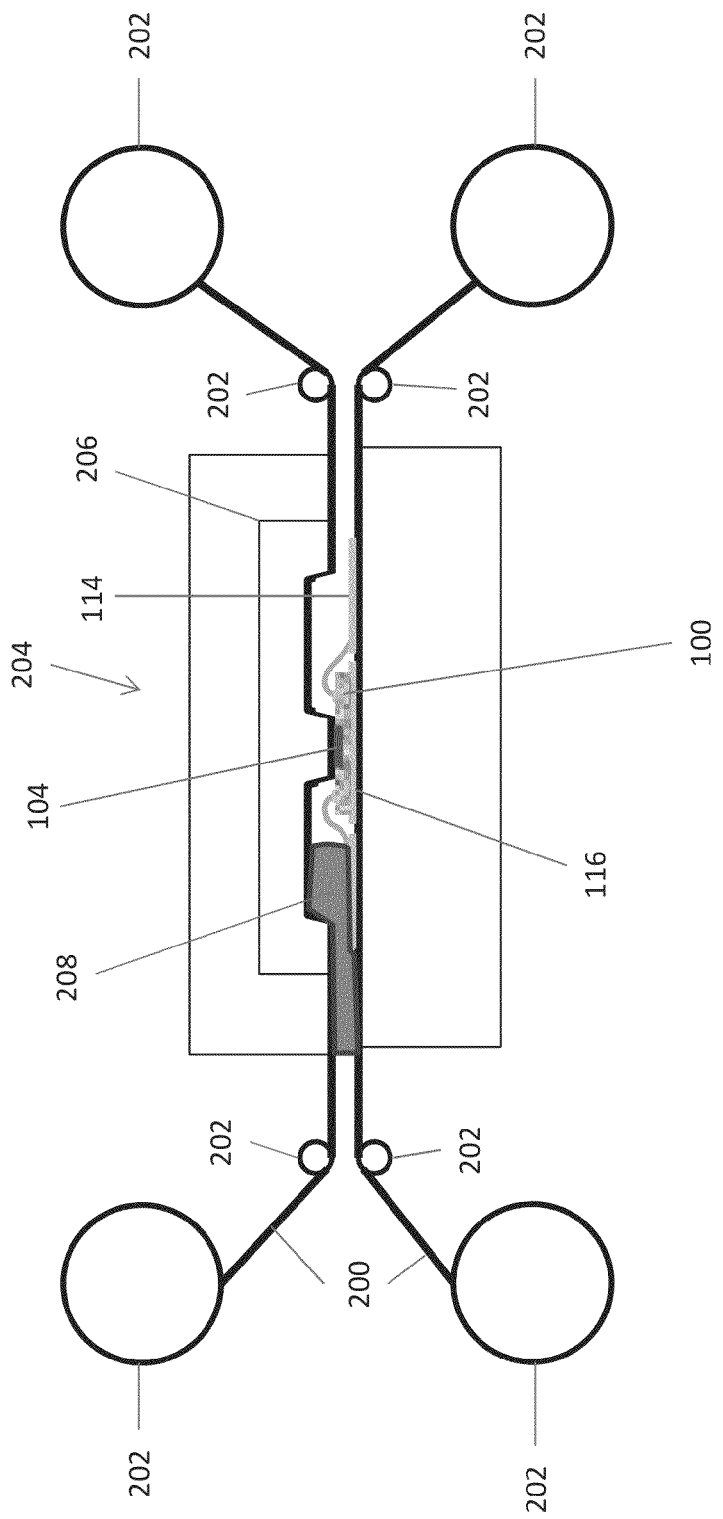
Figure 14D:
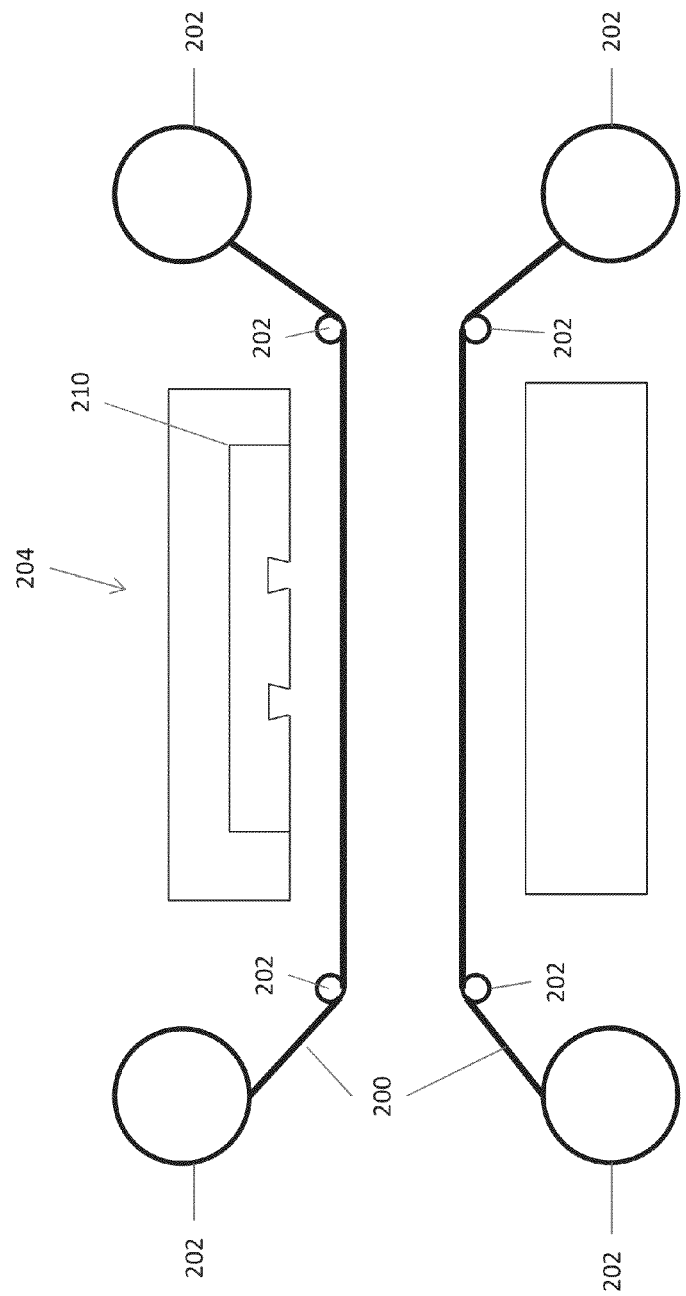
Figure 14E:
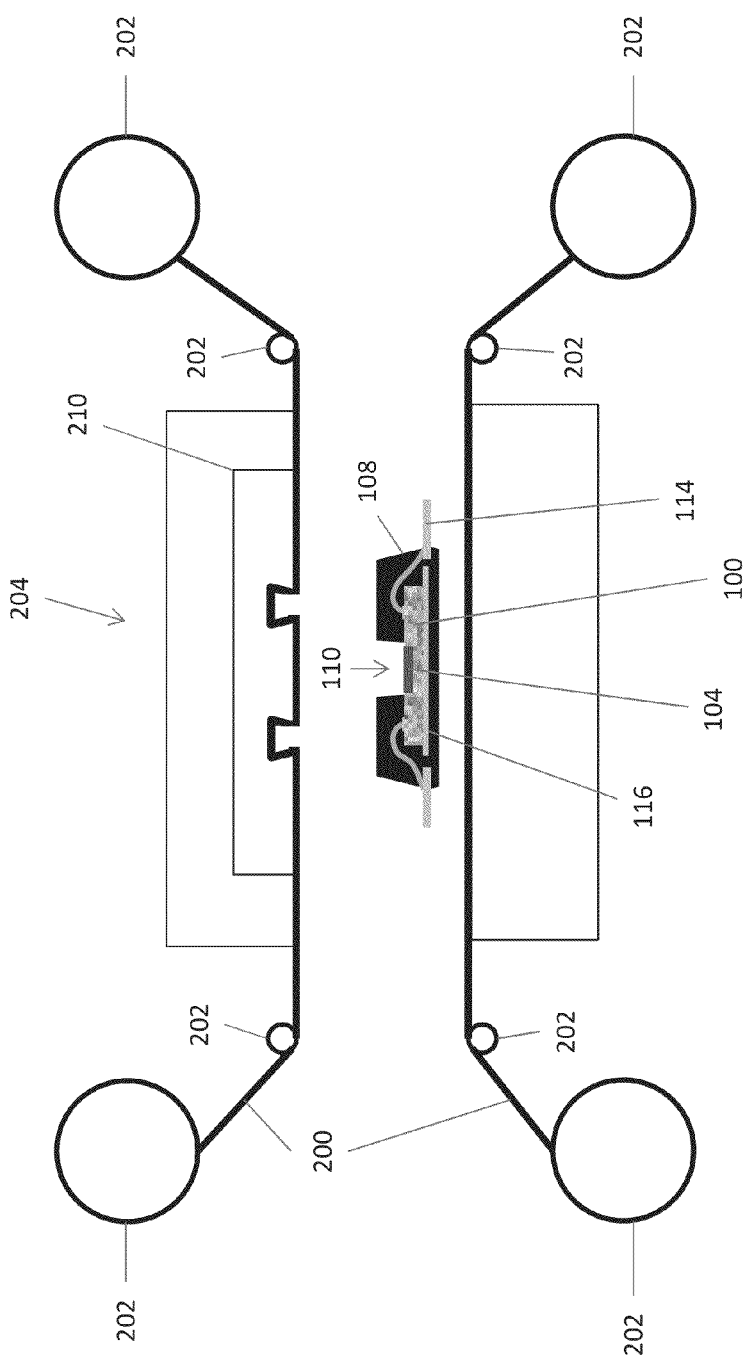

The molding material 208 is first liquefied by heat and pressure, and then forced into the closed mold 204 and held there under additional heat and pressure until all material is solidified (i.e. cured). FIG. 14C shows the package during the molding process. After opening the mold 204, the molded package is unloaded. Next, the vacuum is removed and the films 200 are transported across one length of the mold 204. The first insert 206 is removed and replaced with a second insert 210 which is loaded into the mold 204 as shown in FIG. 14D. The second insert 210 defines the sealing ring to be formed on the side of the molding compound with the cavity. The second insert 210 can be structured to accommodate multiple sealing rings as previously described herein. The molded package is then loaded into the mold 204 as shown in FIG. 14E, and sealing material (not shown for ease of illustration) such as a silicone or thermoplastic elastomer is forced into the mold 204. The sealing material fills the shapes in the second insert 210 and is cured. The completed package is removed from the mold 204 after curing of the sealing ring material. The bottom part of the tool can be outfitted with one or more inserts to form one or more cavities and corresponding sealing rings at the bottom side of the package also as previously described herein. Any desired cavity and sealing ring dimensions and shapes can be accommodated by using appropriately designed insert in the FAM tool.

Figure 15:
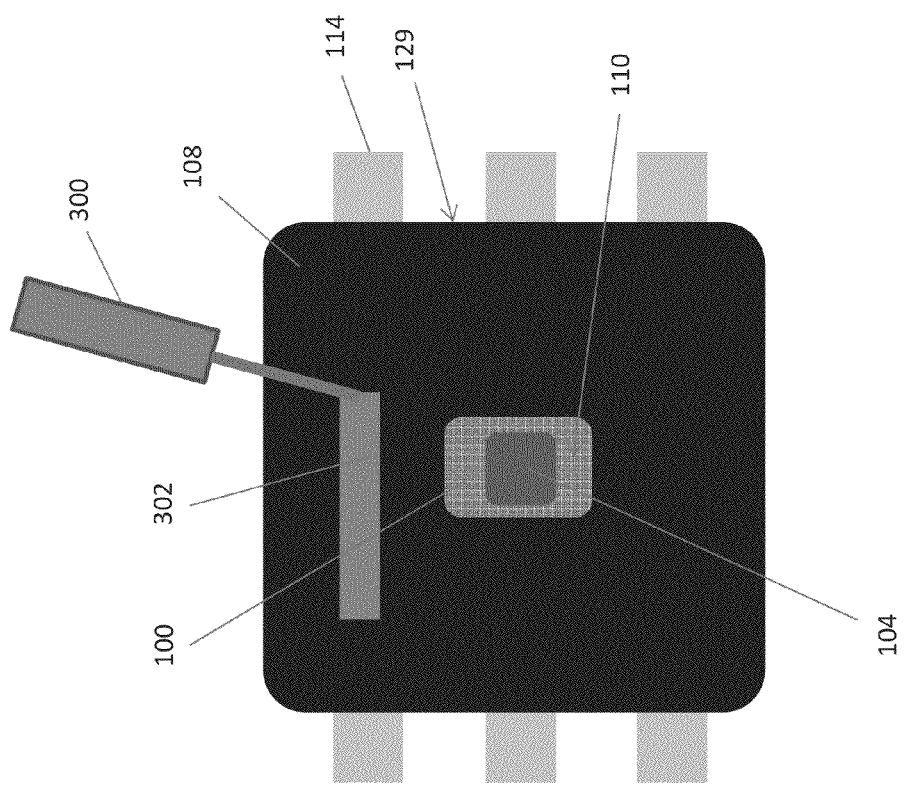
FIG. 15 illustrates a top-down plan view of an embodiment of a molded pressure sensor package during formation of an integrated sealing ring using a dispensing process.

FIG. 15 illustrates another embodiment of a method of manufacturing the pressure sensor package shown in FIG. 1. According to this embodiment, the package is first molded e.g. using FAM technology as previously described herein. The package is then loaded into a dispensing tool which includes a dispenser 300. A basic representation of the dispenser 300 is shown in FIG. 15 for ease of illustration. Under precise control of the dispenser 300, a sealing material 302 such as a silicone or thermoplastic elastomer is dispensed on the side of the molding compound 108 with the cavity 110 after the molding compound 108 has been cured. The sealing material 302 is then cured to form the sealing ring. More than one sealing ring can be formed according to this embodiment, on one or both sides of the molding compound as previously described herein. Furthermore, the dispenser 300 can dispense the sealing material on the sidewalls 129 of the molding compound 108 also as previously described herein.

Figure 16:
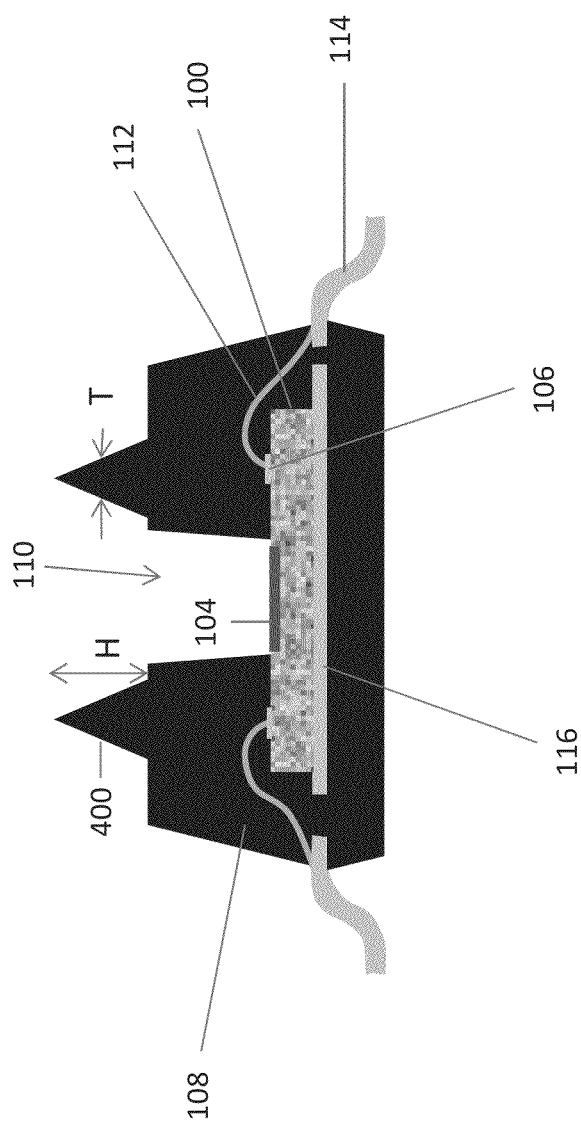
FIG. 16 illustrates a cross-sectional view of yet another embodiment of a molded pressure sensor package with an integrated sealing ring.

FIG. 16 illustrates still another embodiment of a pressure sensor package with an integrated sealing ring. According to this embodiment, the molding compound 108 has a ridge 400 protruding from a side of the molding compound 108 with the cavity 110. The ridge 400 surrounds the cavity 110 and forms a sealing ring. According to the embodiment shown in FIG. 16, the ridge 400 has a triangular cross-sectional shape that varies over a height (H) of the ridge 400 so that the thickness (T) of the ridge 400 is greater closer to the die 100 and smaller further away from the die 100. The ridge 400 can have any suitable dimensions and shape to form a sealing ring, for example any of the dimensions and shapes previously described herein. The dimensions and shape of the ridge 400 can be realized by appropriate design of an insert for use in a FAM molding tool as previously described herein.

Spatially relative terms such as "under", "below", "lower", "over", "upper" and the like, are used for ease of description to explain the positioning of one element relative to a second element. These terms are intended to encompass different orientations of the device in addition to different orientations than those depicted in the figures. Further, terms such as "first", "second", and the like, are also used to describe various elements, regions, sections, etc. and are also not intended to be limiting. Like terms refer to like elements throughout the description.

As used herein, the terms "having", "containing", "including", "comprising" and the like are open-ended terms that indicate the presence of stated elements or features, but do not preclude additional elements or features. The articles "a", "an" and "the" are intended to include the plural as well as the singular, unless the context clearly indicates otherwise.

With the above range of variations and applications in mind, it should be understood that the present invention is not limited by the foregoing description, nor is it limited by the accompanying drawings. Instead, the present invention is limited only by the following claims and their legal equivalents.

What is claimed is:

1. A pressure sensor package, comprising:
   a lead;
   a semiconductor die spaced apart from the lead and comprising a terminal and a diaphragm disposed at a first side of the die, the die configured to change an electrical parameter responsive to a pressure difference across the diaphragm;
   an electrical conductor connecting the terminal to the lead;
   a molding compound encasing the electrical conductor, the die and part of the lead;
   a cavity in the molding compound exposing the diaphragm; and
   a sealing ring disposed on a side of the molding compound with the cavity, the sealing ring surrounding the cavity and having a lower elastic modulus than the molding compound.

2. The pressure sensor package of claim 1, wherein the molding compound has an elastic modulus ranging between 10 GPa and 100 GPa at room temperature and the sealing ring has an elastic modulus ranging between 0.5 MPa and 1 GPa at room temperature.

3. The pressure sensor package of claim 1, wherein the sealing ring has a height ranging between 0.5 mm and 1 mm and a maximum thickness ranging between 0.5 mm and 2 mm.

4. The pressure sensor package of claim 1, wherein the sealing ring comprises a silicone or a thermoplastic elastomer.

5. The pressure sensor package of claim 1, wherein the sealing ring has a first end contacting the molding compound and a second end opposing the first end and spaced apart from the molding compound, the first end being thicker than the second end.

6. The pressure sensor package of claim 1, wherein the sealing ring has a triangular or trapezoidal cross-sectional shape.

7. The pressure sensor package of claim 1, wherein the sealing ring has a curved outer surface.

8. The pressure sensor package of claim 1, wherein the sealing ring has a region anchored within the molding compound.

9. The pressure sensor package of claim 1, further comprising:
   an additional sealing ring disposed on the side of the molding compound with the cavity, the additional sealing ring surrounding the cavity and the other sealing ring and having a lower elastic modulus than the molding compound.

10. The pressure sensor package of claim 1, further comprising:
    an additional cavity in the molding compound at a side of the molding compound opposite the other cavity; and
    an additional sealing ring disposed on the side of the molding compound with the additional cavity, the additional sealing ring surrounding the additional cavity and having a lower elastic modulus than the molding compound.

11. The pressure sensor package of claim 1, wherein the die further comprises an additional diaphragm disposed at the first side of the die and spaced apart from the other diaphragm, the pressure sensor package further comprising:
    an additional cavity in the molding compound at the side of the molding compound with the other cavity, the additional cavity laterally spaced apart from the other cavity by a region of the molding compound and exposing the additional diaphragm; and
    an additional sealing ring disposed on the side of the molding compound with the cavities, the additional sealing ring surrounding the additional cavity and having a lower elastic modulus than the molding compound.

12. The pressure sensor package of claim 1, wherein the sealing ring has a square, rectangular or circular shape.

13. The pressure sensor package of claim 1, wherein the sealing ring completely covers the side of the molding compound with the cavity.

14. The pressure sensor package of claim 13, wherein the sealing ring covers sidewalls of the molding compound.

15. The pressure sensor package of claim 14, wherein the sealing ring covers a side of the molding compound opposite the side with the cavity.

16. The pressure sensor package of claim 1, wherein the molding compound is free of wax at least at the side of the molding compound with the sealing ring.

17. A pressure sensor package, comprising:
    a lead;
    a semiconductor die spaced apart from the lead and comprising a terminal and a diaphragm disposed at a first side of the die, the die configured to change an electrical parameter responsive to a pressure difference across the diaphragm;
    an electrical conductor connecting the terminal to the lead;
    a molding compound encasing the electrical conductor, the die and part of the lead; and a cavity in the molding compound exposing the diaphragm, so that part of the molding compound covers the first side of the die except for the diaphragm, wherein the part of the molding compound that covers the first side of the die except for the diaphragm has a ridge which protrudes outward in a direction away from the die so that the part of the molding compound that covers the first side of the die except for the diaphragm has a nonplanar surface and a thinner region that excludes the ridge and a thicker region that includes the ridge, the ridge surrounding the cavity to form a sealing ring.

18. The pressure sensor package of claim 17, wherein the ridge has a cross-sectional shape that varies over a height of the ridge so that the thickness of the ridge is greater closer to the cavity and smaller further away from the cavity.

19. A method of manufacturing a pressure sensor package, the method comprising:

providing a semiconductor die and a lead spaced apart from one another, the die comprising a terminal and a diaphragm disposed at a first side of the die, the terminal connected to the lead by an electrical conductor, the die configured to change an electrical parameter responsive to a pressure difference across the diaphragm;

encasing the electrical conductor, the die and part of the lead with a molding compound;

forming a cavity in the molding compound that exposes the diaphragm; and forming a sealing ring on a side of the molding compound with the cavity, the sealing ring surrounding the cavity and having a lower elastic modulus than the molding compound.

20. The method of claim 19, further comprising:

placing the die and the lead in a mold of a molding tool, the molding tool further comprising a first insert placed in the mold and one or more films separating the die and the lead from a surface of the mold and a surface of the first insert, the first insert defining the cavity to be formed in the molding compound;

forcing a molding compound material into the mold after the die and the lead are placed in the mold with the first insert;

replacing the first insert with a second insert in the mold after the molding compound material is cured, the second insert defining the sealing ring to be formed on the side of the molding compound with the cavity;

forcing a sealing material into the mold after the second insert is placed in the mold; and removing the pressure sensor package from the mold after the sealing material is cured.

21. The method of claim 19, wherein forming the sealing ring on the side of the molding compound with the cavity comprises:

dispensing a sealing material on the side of the molding compound with the cavity after the molding compound is cured; and curing the sealing material to form the sealing ring.

22. The method of claim 19, wherein the molding compound has an elastic modulus ranging between 10 GPa and 100 GPa at room temperature and the sealing ring has an elastic modulus ranging between 0.5 MPa and 1 GPa at room temperature.

23. The method of claim 19, further comprising:

forming a trench in the side of the molding compound with the cavity;

filling the trench with a sealing material, the sealing material extending outward from the side of the molding compound with the cavity; and curing the sealing material to form the sealing ring with a region anchored within the molding compound.

24. The method of claim 19, further comprising:

forming an additional sealing ring on the side of the molding compound with the cavity, the additional sealing ring surrounding the cavity and the other sealing ring and having a lower elastic modulus than the molding compound.

25. The method of claim 19, further comprising:

forming an additional cavity in the molding compound at a side of the molding compound opposite the other cavity; and forming an additional sealing ring on the side of the molding compound with the additional cavity, the additional sealing ring surrounding the additional cavity and having a lower elastic modulus than the molding compound.

26. The method of claim 19, wherein the die further comprises an additional diaphragm disposed at the first side of the die and spaced apart from the other diaphragm, the method further comprising:

forming an additional cavity in the molding compound at the side of the molding compound with the other cavity, the additional cavity laterally spaced apart from the other cavity by a region of the molding compound and exposing the additional diaphragm; and forming an additional sealing ring on the side of the molding compound with the cavities, the additional sealing ring surrounding the additional cavity and having a lower elastic modulus than the molding compound.

* * * * *